(12) United States Patent
Shim et al.

(10) Patent No.: US 7,893,442 B2
(45) Date of Patent: Feb. 22, 2011

(54) SCHOTTKY DIODE HAVING LOW BREAKDOWN VOLTAGE AND METHOD FOR FABRICATING THE SAME

(75) Inventors: Dong-sik Shim, Yongin-si (KR); Hyung Choi, Yongin-si (KR); Young-hoon Min, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1051 days.

(21) Appl. No.: 11/702,489

(22) Filed: Feb. 6, 2007

(65) Prior Publication Data
US 2007/0278608 A1   Dec. 6, 2007

(30) Foreign Application Priority Data
Jun. 1, 2006   (KR)   .................. 10-2006-0049293

(51) Int. Cl.
H01L 29/15 (2006.01)
H01L 29/66 (2006.01)
H01L 21/44 (2006.01)
H01L 21/28 (2006.01)

(52) U.S. Cl. .......... 257/77; 257/E29.327; 257/E21.477; 257/481; 438/571

(58) Field of Classification Search ............... 257/77, 257/E29.327; 438/571
See application file for complete search history.

(56) References Cited

U.S. PATENT DOCUMENTS

| | | | |
|---|---|---|---|
| 5,583,348 A * | 12/1996 | Sundaram .................. 257/73 |
| 2004/0245344 A1 * | 12/2004 | Fischer et al. .............. 235/491 |
| 2006/0157748 A1 * | 7/2006 | Chong et al. ................ 257/288 |
| 2007/0001193 A1 * | 1/2007 | Drobny et al. .............. 257/107 |

* cited by examiner

*Primary Examiner*—David A Zarneke
*Assistant Examiner*—Igwe U Anya
(74) *Attorney, Agent, or Firm*—Sughrue Mion, PLLC

(57) ABSTRACT

Provided are a schottky diode having an appropriate low breakdown voltage to be used in a radio frequency identification (RFID) tag and a method for fabricating the same. The schottky diode includes a silicon substrate having a structure in which an N-type well is formed on a P-type substrate, an insulating layer surrounding a circumference of the N-type well so as to electrically separate the N-type well from the P-type substrate, an N+ doping layer partly formed in a portion of a region of an upper surface of the N-type well, an N– doping layer partly formed in the other portion of a region of the upper surface of the N-type well, a cathode formed on the N+ doping layer, and an anode formed on the N– doping layer.

22 Claims, 8 Drawing Sheets

SCHOTTKY DIODE HAVING LOW BREAKDOWN VOLTAGE AND METHOD FOR FABRICATING THE SAME

CROSS-REFERENCE TO RELATED PATENT APPLICATIONS

This application claims priority from Korean Patent Application No. 10-2006-0049293, filed on Jun. 1, 2006, in the Korean Intellectual Property Office, the disclosure of which is incorporated herein in its entirety by reference.

BACKGROUND OF THE INVENTION

1. Field of the Invention

Methods and apparatuses consistent with the present invention relate to a schottky diode, and more particularly, to a schottky diode having an appropriate low breakdown voltage to be used in a radio frequency identification (RFID) tag and a method for fabricating the same.

2. Description of the Related Art

A radio frequency identification (RFID) system is a non-contact type recognition system which transmits and processes information about products and ambient environmental information by attaching a small-sized chip to all kinds of products. RFID systems can record a greater capacity of information than bar codes. Additionally, recognition of information is possible from a greater distance and several products can be recognized simultaneously. The RFID system includes an RFID tag and a reader. Moreover, the RFID tag includes an RF interface, a control circuit, a memory, and an antenna, which are manufactured in one semiconductor device. The RFID tag is classified as a passive RFID tag and an active RFID tag. A battery is built in the active RFID tag. However, since power is not supplied to the passive RFID tag, the passive RFID tag must operate by an energy supplied from a propagation signal of the reader.

FIG. 1 is a schematic view of a related art passive RFID tag. Referring to FIG. 1, the passive RFID tag includes antennas 10a and 10b for receiving a propagation signal from a reader (not shown), an RF interface and control logic 13 for processing the received signal, and a rectifying unit 11 for rectifying the propagation signal received from the antennas 10a and 10b and for transmitting the rectified signal to the RF interface and control logic 13. In FIG. 1, for explanatory conveniences, the rectifying unit 11 is separated from the RF interface and control logic 13. However, in actuality, the rectifying unit 11 and the RF interface and control logic 13 may be manufactured in a single chip. In this structure, when the propagation signal received from the antennas 10a and 10b has a voltage less than a predetermined level, the propagation signal is applied to the RF interface and control logic 13 via a first schottky diode 11a. However, when the RFID tag is located too close to the reader (not shown) and the intensity of the received propagation signal increases by a predetermined level, a portion of the propagation signal is bypassed via a second schottky diode 11b so that the RF interface and control logic 13 is protected. The voltage in which a bypass occurs is determined by a breakdown voltage of the second schottky diode 11b.

However, if the breakdown voltage of the second schottky diode 11b is high, a voltage Vaa at both ends of a capacitor 12 may be excessively increased. Then, a voltage to be applied to the RF interface and control logic 13 is increased and malfunction of the RF interface and control logic 13 may occur. Thus, the breakdown voltage of the second schottky diode 11b is preferably as low as possible. However, the breakdown voltage of a schottky diode that is currently used is about −9V and there is a possibility that the voltage Vaa may be increased up to 9V. Accordingly, a voltage that is as low as possible should be applied to the RF interface and control logic 13 by reducing the breakdown voltage of the related art schottky diode to about −3V to −6V.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a schottky diode having a lower breakdown voltage compared to the related art and a method for fabricating the same.

According to an aspect of the present invention, there is provided a schottky diode, the schottky diode including: a silicon substrate having a structure in which an N-type well is formed on a P-type substrate; an insulating layer surrounding a circumference of the N-type well so as to electrically separate the N-type well from the P-type substrate; an N+ doping layer partly formed in a portion of a region of an upper surface of the N-type well; an N− doping layer partly formed in another portion of a region of the upper surface of the N-type well; a cathode formed on the N+ doping layer; and an anode formed on the N− doping layer.

An ohmic contact may be formed between the N+ doping layer and the cathode.

A doping concentration of the N+ doping layer may be about $10^{20}/cm^3$.

A schottky contact may be formed between the N− doping layer and the anode.

A doping concentration of the N− doping layer may be about $10^{18}/cm^3$.

The N− doping layer may be formed using ion implantation.

A thickness of the N− doping layer may be about 200 nm, for example.

A doping concentration of the N-type well may be about $10^{16}$ to $5\times10^{17}/cm^3$.

The N+ doping layer and the N− doping layer may contact each other.

The schottky diode may further include a P+ guard ring formed between the N+ doping layer and the N− doping layer.

The insulating layer may be a shallow trench isolation (STI).

According to another aspect of the present invention, there is provided a method for fabricating a schottky diode, the method including: providing a silicon substrate having a structure in which an N-type well is formed on a P-type substrate; forming an insulating layer surrounding a circumference of the N-type well so as to electrically separate the N-type well from the P-type substrate; N− doping at least a portion of an upper surface of the N-type well; N+ doping another portion of the upper surface of the N-type well; forming a cathode on the N+ doped region; forming an anode on the N− doped layer; and activating the N+ and N− doped regions by heat-treating them.

The forming of the insulating layer may include: forming a trench by etching a circumference of the N-type well; and burying an insulating material within the trench.

The N+ doping may be performed so that a portion of the N− doped region is partly N+ doped.

The N+ doping may be performed so that a non-N− doped portion of the upper surface of the N-type well is partly N+ doped.

According to another aspect of the present invention, there is provided a radio frequency identification (RFID) tag in which the schottky diode is used as a rectifying device and a device for bypassing a high voltage.

BRIEF DESCRIPTION OF THE DRAWINGS

The above and other aspects of the present invention will become more apparent by describing in detail exemplary embodiments thereof with reference to the attached drawings in which.

DETAILED DESCRIPTION OF EXEMPLARY EMBODIMENTS OF THE INVENTION

Figure 1:
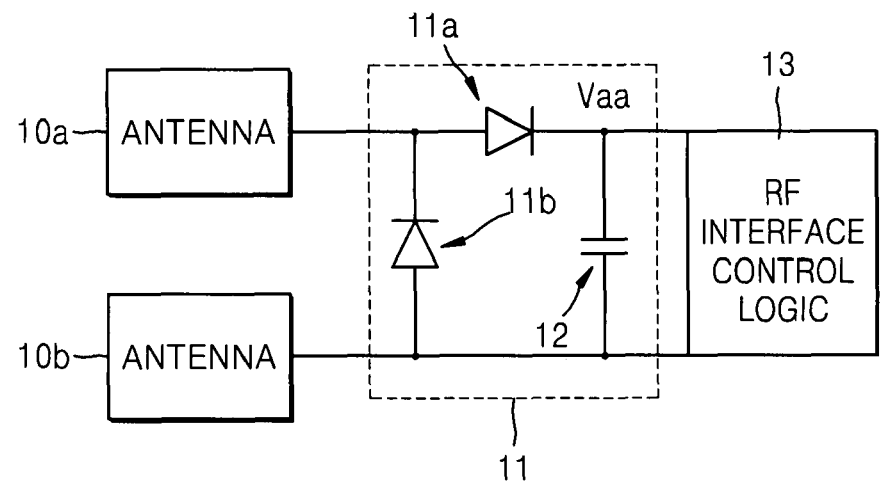
FIG. 1 is a schematic view of a related art radio frequency identification (RFID) tag.
Figure 2A:
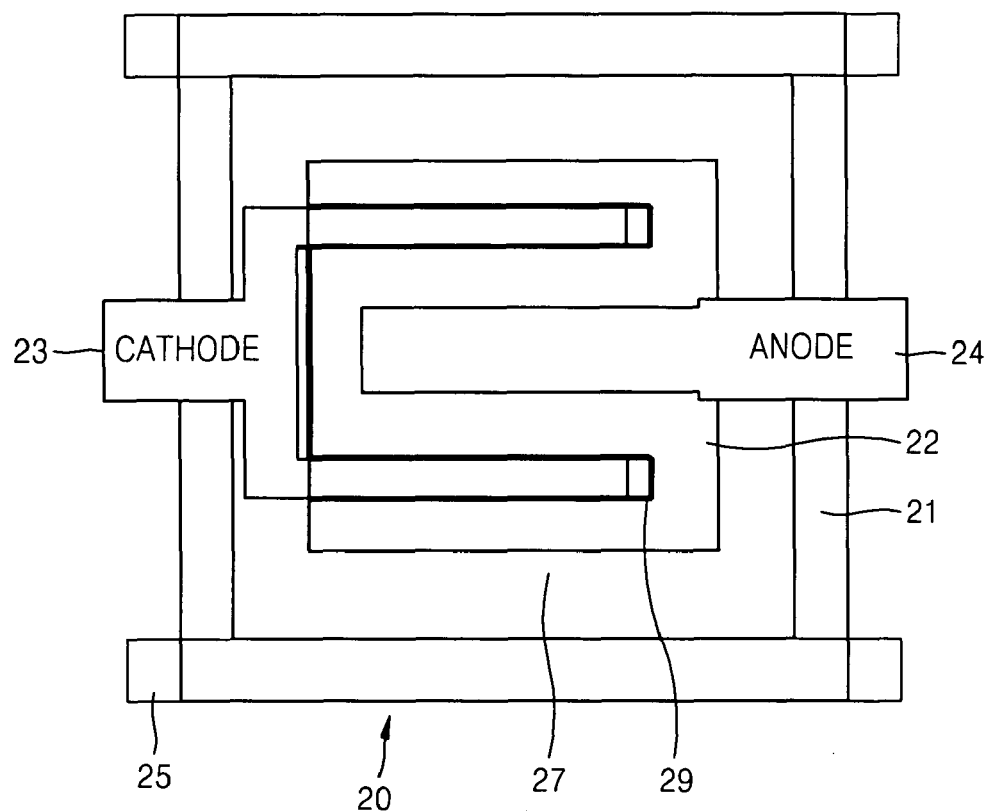
FIG. 2A is a plan view of a related art schottky diode used in an RFID tag.

A schottky diode uses rectification caused by a schottky barrier. The schottky diode is appropriate for a high-speed operation because an operation of controlling current is performed within a very narrow schottky barrier. FIG. 2A is a plan view of a related art schottky diode used in an RFID tag, and FIG. 2B is a schematic cross-sectional view of the schottky diode shown in FIG. 2A.

Figure 2B:
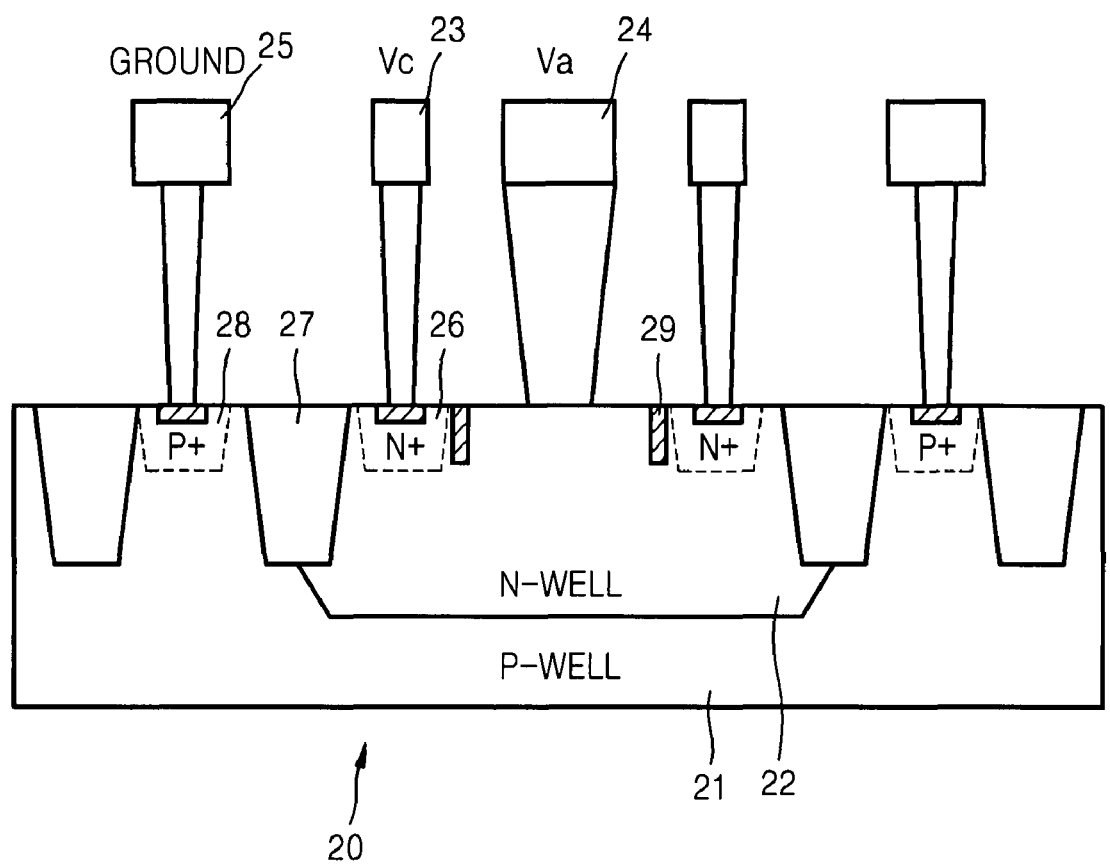
FIG. 2B is a schematic cross-sectional view of the schottky diode shown in FIG. 2A.

Referring to FIGS. 2A and 2B, in general, a schottky diode 20 uses a silicon substrate in which an N-type well 22 is formed within a P-type substrate 21. In the silicon substrate, an insulating layer 27 is inserted in a circumference of the N-type well 22 so as to electrically separate the P-type substrate 21 and the N-type well 22 from each other. In the schottky diode 20, a cathode 23 and an anode 24 are formed on an upper surface of the N-type well 22. On the other hand, a ground electrode 25 is formed on an upper surface of the P-type substrate 21. The cathode 23 and the anode 24 may be opposite to each other in an interlocking manner.

In addition, a high-concentration P+ doping region 28 may be formed on the upper surface of the P-type substrate 21 that contacts the ground electrode 25 so that a metal-semiconductor junction between the ground electrode 25 and the P-type substrate 21 has an ohmic contact, as shown in FIG. 2B. Similarly, a high-concentration N+ doping region 26 may be formed on the upper surface of the N-type well 22 that contacts the cathode 23 so that a metal-semiconductor junction between the cathode 23 and the N-type well 22 has an ohmic contact, as shown in FIG. 2B. On the other hand, a comparatively low doping concentration is kept on the upper surface of the N-type well 22 that contacts the anode 24 so that a schottky contact can be formed on a metal-semiconductor junction surface between the anode 24 and the N-type well 22. In order to prevent a leakage of electrons between the anode 24 and the cathode 23, high-concentration P+ doping is performed around the high-concentration N+ doping region 26, thereby forming a guard ring 29.

In this structure, a schottky barrier is formed between the anode 24 and the N-type well 22. Thus, when a voltage is applied in a forward direction, electrons located in a conductive band of the N-type well 22 may go across a depletion region between the N-type well 22 and the anode 24 and may move to the anode 24. However, when a voltage is applied in a backward direction, due to the schottky barrier, any movement of electrons to the N-type well 22 from the anode 24 occurs hardly. In the related art schottky diode 20 having the structure shown in FIGS. 2A and 2B, a breakdown voltage with respect to a backward bias is very large, about −9V. When a schottky diode is used for a rectifying operation, such a high breakdown voltage doesn't matter. However, as described above, when a diode is used for a bypass for preventing a high voltage from being applied to a circuit, a high breakdown voltage matters.

In general, the size of the breakdown voltage with respect to a forward bias increases as the size of the schottky barrier between metal and a semiconductor increases or as the thickness of a depletion layer between the metal and the semiconductor increases. The size of the schottky barrier and the thickness of the depletion layer are usually determined by a difference in a work function between the metal and the semiconductor. Thus, when the same metal material is used, the higher the doping concentration of the semiconductor is, the smaller the size of the schottky barrier is, whereas the lower the doping concentration of the semiconductor is, the larger the size of the schottky barrier is. However, if the doping concentration of the semiconductor is too high, any schottky barrier between the metal and the semiconductor is formed so that a junction surface between the metal and the semiconductor has an ohmic contact.

Thus, in order to reduce a breakdown voltage of the schottky diode to a proper level, intermediate-concentration N− doping is performed on the upper surface of the N-type well 22 that contacts the anode 24. That is, the present invention is characterized in that the upper surface of the N-type well 22 is doped with an intermediate concentration that is higher than the concentration of the N-type well 22 that contacts the anode 24 and that is lower than a doping concentration in which an ohmic contact occurs.

Figure 3:
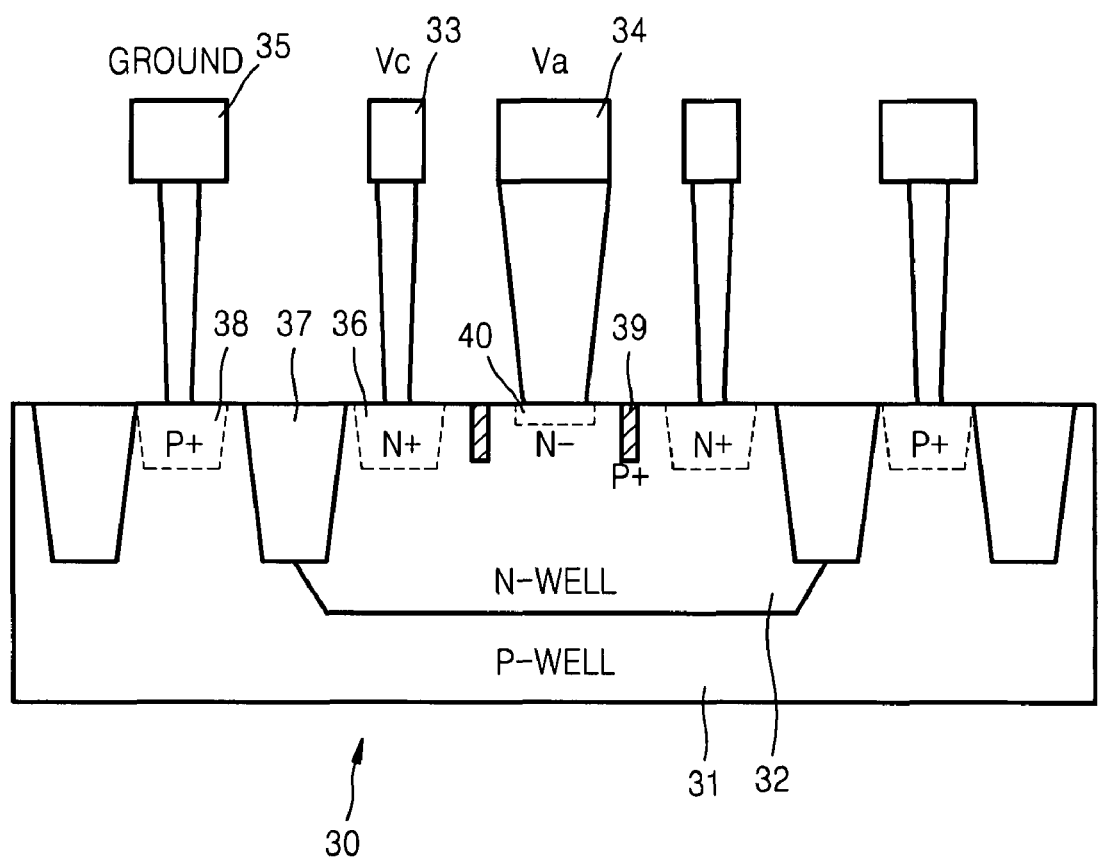
FIG. 3 is a schematic cross-sectional view of a schottky diode having a low breakdown voltage according to an exemplary embodiment of the present invention.

FIG. 3 is a cross-sectional view showing a characteristic structure of an exemplary embodiment of the present invention. Referring to FIG. 3, a schottky diode 30 includes a silicon substrate having a structure in which a low-concentration N-type well 32 is formed on a low-concentration P-type substrate 31, an insulating layer 37 which surrounds the circumference of the N-type well 32 so as to electrically separate the N-type well 32 from the P-type substrate 31, an N+ doping layer 36 partly formed in a portion of a region of an upper surface of the N-type well 32, an intermediate-concentration N− doping layer 40 partly formed in the other portion of the region of the upper surface of the N-type well 32, a cathode 33 formed on the high-concentration N+ doping layer 36, and an anode 34 formed on the intermediate-concentration N− doping layer 40. In addition, similar to the related art schottky diode, a high-concentration P+ doping layer 38 may be partly formed on the upper surface of the P-type substrate 31. A ground electrode 35 is disposed on the P+ doping layer 38. In addition, as shown in FIG. 3, a P+ guard ring 39 may also be further disposed between the N+ doping layer 36 and the N− doping layer 40, so as to prevent a leakage of electrons.

The insulating layer 37 may be a shallow trench isolation (STI), for example. As shown in FIG. 3, the STI may be formed by forming a trench between the N-type well 32 and the P-type substrate 31 and by burying an insulating material within the trench. The STI has the advantages of an excellent isolation property and a small occupation area.

The doping concentration of the low-concentration P-type substrate 31 and the doping concentration of the low-concentration N-type well 32, which are separated from each other by the insulating layer 37, may be in the range of about $10^{16}$ to $5 \times 10^{17}/cm^3$, respectively. Then, an ohmic contact is formed between the cathode 33 and the N+ doping layer 36 and between the ground electrode 35 and the P+ doping layer 38, respectively.

In addition, according to the current exemplary embodiment, the doping concentration of the intermediate-concentration N− doping layer 40 may be about $10^{18}/cm^3$, that is a little larger than the doping concentration of the N-type well 32. In this case, a schottky contact can be still formed between the N− doping layer 40 and the anode 34. However, compared to the related art schottky diode, the schottky barrier becomes lower and the depletion layer becomes thinner so that a breakdown voltage can be reduced compared to the related art.

The N− doping layer 40 may be formed using ion implantation based on a well-known process of forming a lightly doped drain (LDD), for example. The LDD is a technology for guaranteeing the reliability of a CMOS. That is, the LDD is formed by forming a relatively low, intermediate-concentration N− doping region in a high-concentration N+ doped drain region using ion implantation so as to alleviate an electric field of a contact portion in which a channel and a drain of the CMOS contact each other. The LDD alleviates the intensity of the electric field in a horizontal direction, prevents implantation of a hot carrier and reduces long-time degradation of the CMOS. Since the N− doping layer 40 can be formed using the same process as the process of forming an LDD of the CMOS, a new process does not have to be added to the entire process of fabricating an RFID tag chip. This is because the N− doping layer 40 of the schottky diode must be formed together when the LDD is formed in the process of fabricating the CMOS within the RFID tag chip. The LDD within the CMOS and the N− doping layer 40 of the schottky diode according to the present invention are common in that they are intermediate-concentration N− doping regions but effects thereof are different from each other. That is, in the schottky diode according to the exemplary embodiment of the present invention, the N− doping layer 40 reduces a breakdown voltage of the schottky diode but the LDD within the CMOS increases the breakdown voltage.

Figure 4:
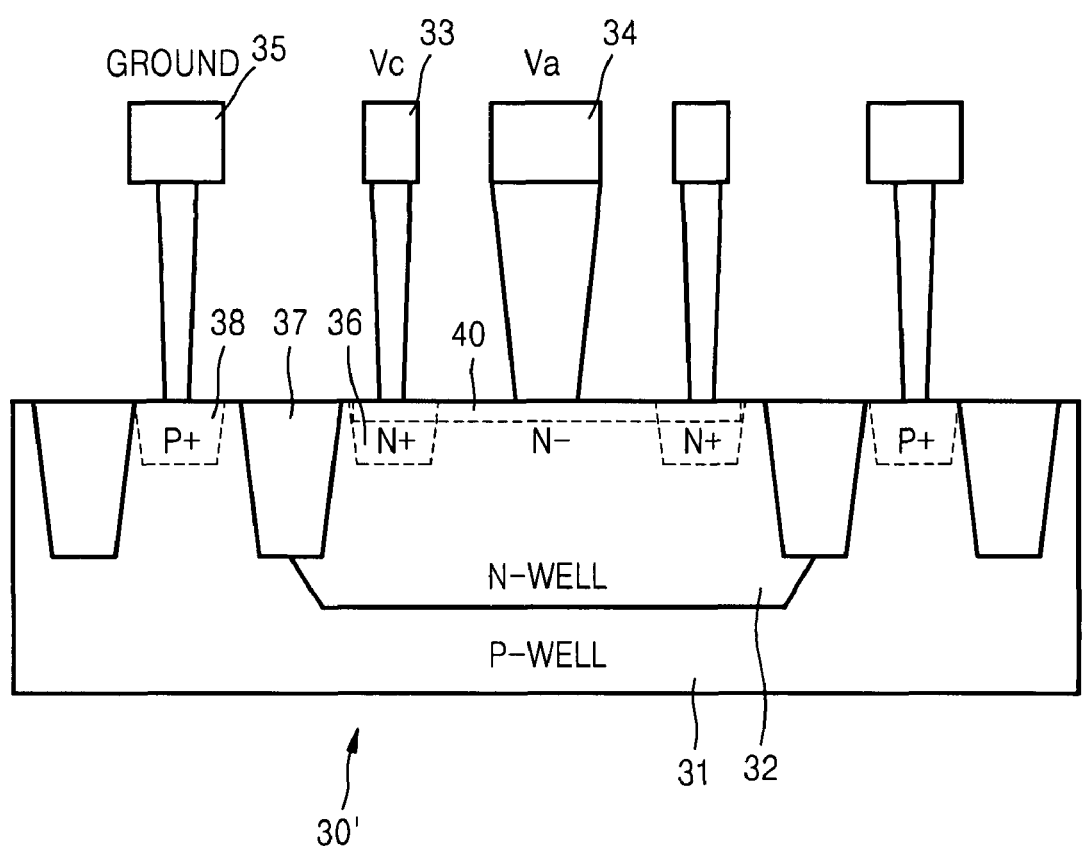
FIG. 4 is a schematic cross-sectional view of a schottky diode having a low breakdown voltage according to another exemplary embodiment of the present invention.

FIG. 4 shows a schottky diode 30' according to another exemplary embodiment of the present invention. Comparing the schottky diode 30 of FIG. 3 with the schottky diode 30' of FIG. 4, in the case of the schottky diode 30 of FIG. 3, the N− doping layer 40 is formed only in a region of the N-type well 32 that contacts the anode 34. On the other hand, in the case of the schottky diode 30' of FIG. 4, the N− doping layer 40 is wider so that the N+ doping layer 36 and the N− doping layer 40 contact each other. Thus, in FIG. 4, the N− doping layer 40 can be formed by performing N− doping on the entire upper surface of the N-type well 32 without the need for partly performing N− doping only on a region in which the N-type well 32 will contact the anode 34. After that, by partly N+ doping only a region of the N-type well 32 which will contact the cathode 33, the schottky diode 30' of FIG. 4 can be formed.

Figure 5:
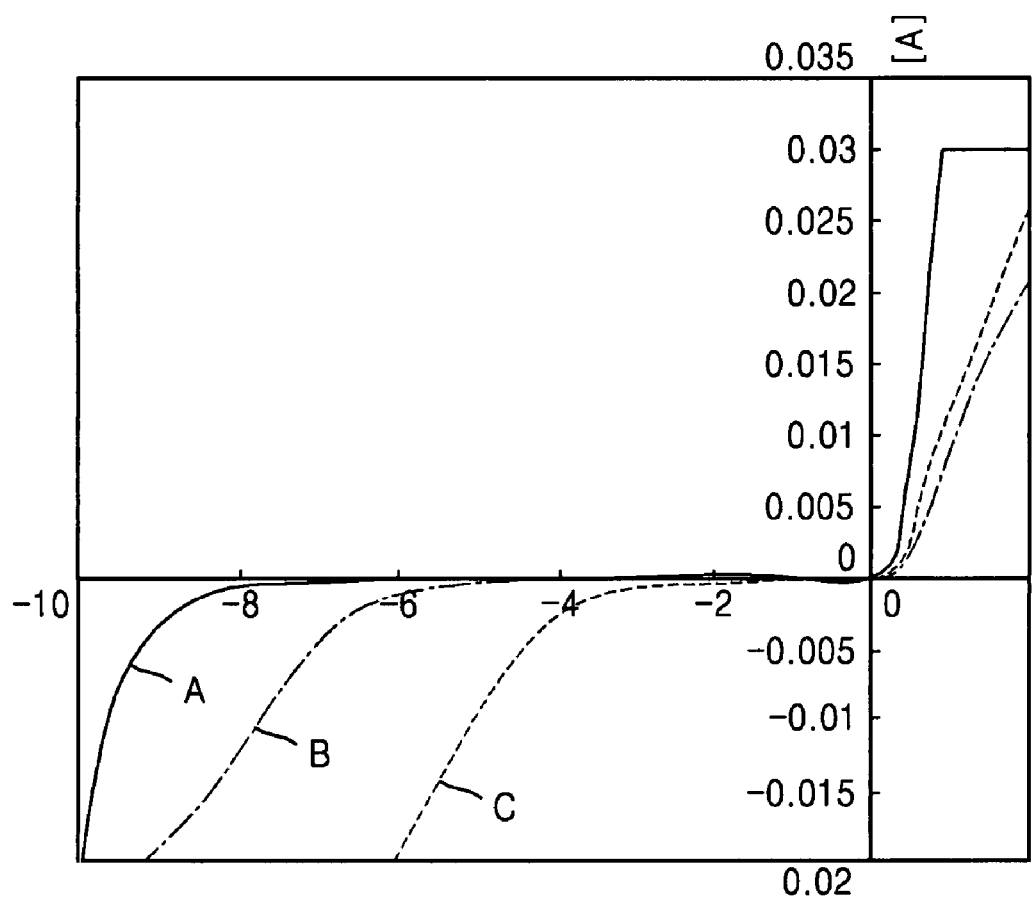
FIG. 5 is a graph of a breakdown voltage of a related art schottky diode versus a breakdown voltage of a schottky diode according to an exemplary embodiment of the present invention.

FIG. 5 is a graph of a breakdown voltage of the related art schottky diode 20 and breakdown voltages of the schottky diodes 30 and 30' shown in FIGS. 3 and 4. As shown in the graph A of FIG. 5, the breakdown voltage of the related art schottky diode 20 is very high, about −9V. On the other hand, the schottky diode 30 of FIG. 3 has a breakdown voltage of about −6V, as shown in the graph B of FIG. 5. In addition, the schottky diode 30' of FIG. 4 has a more reduced breakdown voltage of about −3.5V, as shown in the graph C of FIG. 5. Thus, when the schottky diode according to the exemplary embodiment of the present invention is used as a rectifying device for an RFID tag and a device for bypassing a high voltage, an excessive voltage can be prevented from being applied to a circuit for an RFID tag. Thus, the reliability of the RFID tag can be guaranteed, compared to the related art RFID tag, and an RFID tag having a long life span can be provided.

A method for fabricating a schottky diode according to an exemplary embodiment of the present invention will now be described with reference to FIGS. 6A through 6E.

Figure 6A:
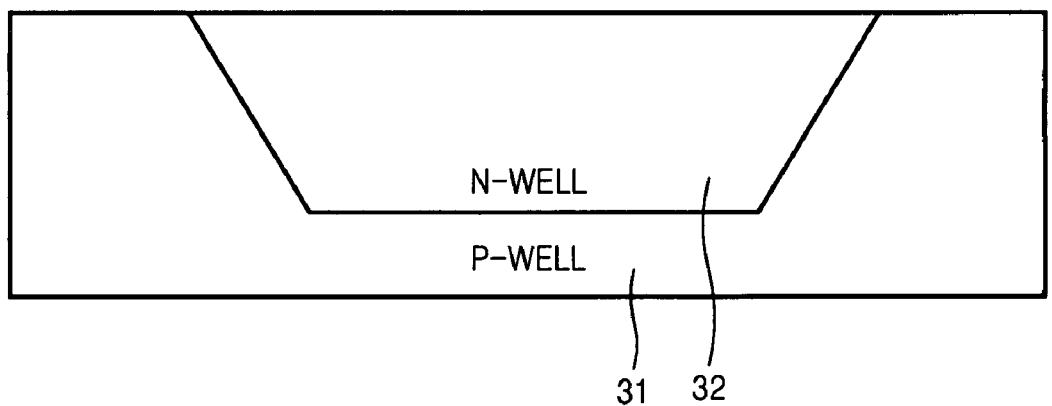
FIGS. 6A through 6E are cross-sectional views illustrating a method for fabricating a schottky diode according to an exemplary embodiment of the present invention.

Referring to FIG. 6A, a silicon substrate in which a low-concentration N-type well 32 is formed on a low-concentration P-type substrate 31 is prepared. As described previously, the doping concentration of the low-concentration P-type substrate 31 and the doping concentration of the low-concentration N-type well 32 may be in the range of about 1016 to $5 \times 10^{17}/cm^3$, respectively.

Figure 6B:
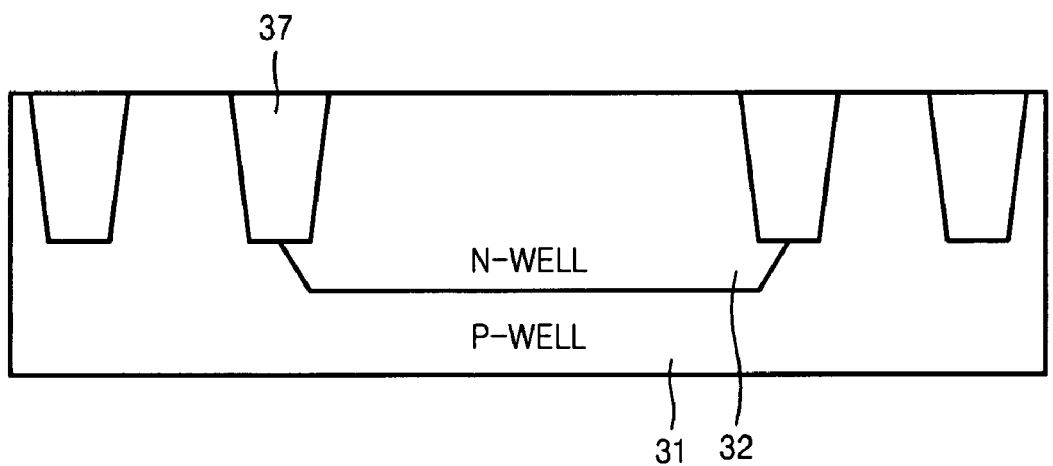

Referring to FIG. 6B, an insulating layer 37 which surrounds the circumference of the N-type well 32 is formed so as to electrically separate the N-type well 32 from the P-type substrate 31. As described previously, an insulating layer 37 is a shallow trench isolation (STI). Thus, the insulating layer 37 may be formed by forming a trench by etching the circumference of the N-type well 32 between the N-type well 32 and the P-type substrate 31 and then burying an insulating material within the trench.

Figure 6C:
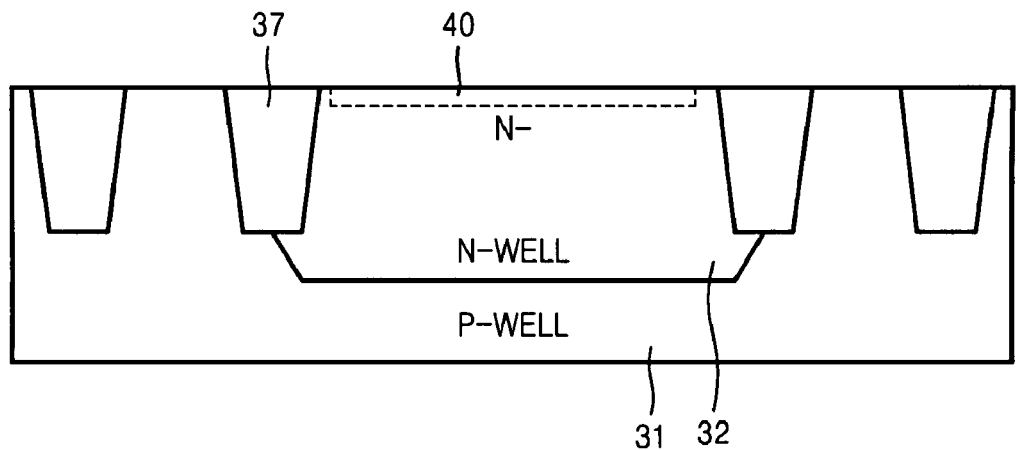

Referring to FIG. 6C, at least a portion of a region of the upper surface of the N-type well 32 is N− doped with an intermediate-concentration of about $10^{18}/cm^3$, thereby forming an intermediate-concentration N− doping layer 40. For example, when the schottky diode 30 of FIG. 3 is formed, a region to be doped of the upper surface of the N-type well 32 will be partly defined as a region in which the N-type well 32 will contact an anode 34 which will be formed later. However, when a schottky diode 30' of FIG. 4 is formed, almost the entire region of the upper surface of the N-type well 32 may be doped. As described previously, when an RFID tag chip is fabricated, a process of forming the N− doping layer 40 may be performed using ion implantation simultaneously with a process of forming an LDD region of a CMOS. In this case, implantation of ions may be performed until the thickness of the N− doping layer 40 is about 200 nm. However, the thickness of the N− doping layer 40 is not necessarily defined to 200 nm and may vary according to a design of the entire size of the schottky diode.

Figure 6D:
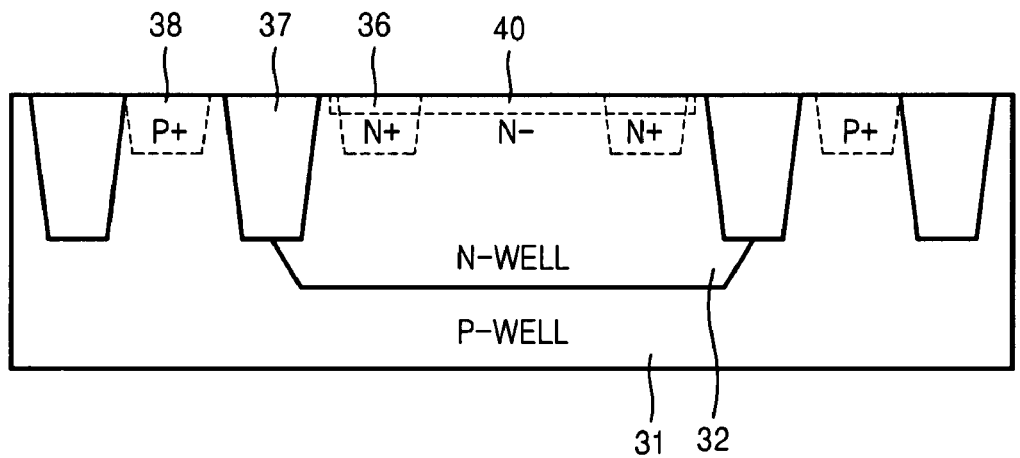

Referring to FIG. 6D, after the N− doping layer 40 is formed, a portion of the region of the upper surface of the N-type well 32 is partly N+ doped with a high concentration of about $10^{20}/cm^3$, thereby forming an N+ doping layer 36. Then, a portion of a region of the upper surface of the P-type substrate 31 which is located outside the insulating layer 37 is partly P+ doped with a high concentration of about $10^{20}/cm^3$, thereby forming a P+ doping layer 38. The high-concentration N+ doped N+ doping layer 36 on the upper surface of the N-type well 32 is a region in which a cathode 33 will be formed later. In addition, the high-concentration P+ doped P+ doping layer 38 on the upper surface of the P-type well 31 is a region in which a ground electrode 35 will be formed later. If the schottky diode 30 of FIG. 3 is to be formed, a portion of a non-N-doped region of the upper surface of the low-concentration N-type well 32 is partly N+ doped, thereby forming the N+ doping layer 36. However, if the schottky diode 30' of FIG. 4 is to be formed, a portion of the intermediate-concentration N− doped N− doping layer 40 on the N-type well 32 is partly N+ doped, thereby forming the N+ doping layer 36. Although not shown in FIG. 6D, a P+ guard ring 39 may be further formed by performing P+ doping in a space between the high-concentration N+ doping layer 36 and the intermediate-concentration N− doping layer 40.

Figure 6E:
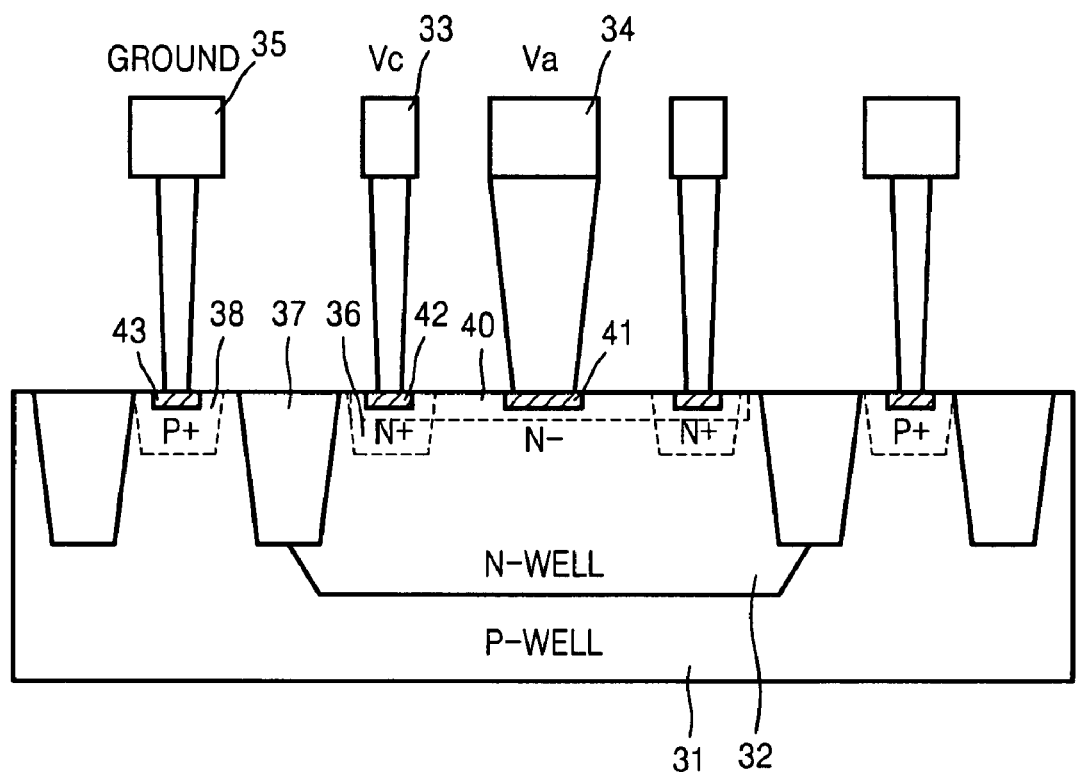

Referring to FIG. 6E, the cathode 33, the ground electrode 35, and the anode 34 are formed on the N+ doping layer 36, the P+ doping layer 38, and the N− doping layer 40, respectively. The electrodes may be finally formed by forming a mask on a resultant structure formed in the processes shown in FIGS. 6A through 6D, by patterning and etching a portion in which the electrodes are to be formed, by filling metal used in forming the electrodes in a space in which the mask is etched, and then by removing the mask. Here, the anode 34 may be a multi-layered electrode having a Ti/TiN/Al structure. In addition, the cathode 33 may be formed of $CoSi_2$, for example, and the ground electrode 35 may also be formed of $CoSi_2$, for example. The doped regions are activated by heat-treating the N+, P+, and N− doped regions at a temperature of about 400° C. after the electrodes 33, 34, and 35 are formed. In this procedure, a portion of the metal used in forming the electrodes is naturally diffused into a semiconductor substrate and salicide layers 41, 42, and 43 are formed under the electrodes 33, 34, and 35. For example, the salicide layer 41 under the anode 34 is $TiSi_2$, the salicide layer 42 under the cathode 33 is $CoSi_2$, and the salicide layer 43 under the ground electrode 35 is $CoSi_2$.

As described above, according to the exemplary embodiment of the present invention, a schottky diode having a lower breakdown voltage compared to the related art can be provided. Thus, by using the schottky diode according to the exemplary embodiment of the present invention as a rectifying device for an RFID tag and a device for bypassing a high voltage, an excessive voltage can be prevented from being applied to a circuit for the RFID tag. Accordingly, the reliability of the RFID tag can be guaranteed compared to the related art RFID tag and the RFID tag having a long life span can be provided.

While the present invention has been particularly shown and described with reference to exemplary embodiments thereof, it will be understood by those of ordinary skill in the art that various changes in form and details may be made therein without departing from the spirit and scope of the exemplary embodiment of the present invention as defined by the following claims.

What is claimed is:

1. A schottky diode comprising:
   a silicon substrate which has a structure in which an N-type well is formed on a P-type substrate;
   an insulating layer which surrounds a circumference of the N-type well so as to electrically separate the N-type well from the P-type substrate;
   an N+ doping layer formed in a first portion of a region of an upper surface of the N-type well;
   an N− doping layer formed in a second portion of the region of the upper surface of the N-type well;
   a cathode formed on the N+ doping layer; and
   an anode formed on the N− doping layer,
   wherein the doping concentration of the N− doping layer is larger than that of the N type well and less than that of the N+ doping layer.

2. The schottky diode of claim 1, wherein an ohmic contact is formed between the N+ doping layer and the cathode.

3. The schottky diode of claim 2, wherein a doping concentration of the N+ doping layer is substantially $10^{20}/cm^3$.

4. The schottky diode of claim 1, wherein a schottky contact is formed between the N− doping layer and the anode.

5. The schottky diode of claim 4, wherein a doping concentration of the N− doping layer is substantially $10^{18}/cm^3$.

6. The schottky diode of claim 4, wherein the N− doping layer is formed using ion implantation.

7. The schottky diode of claim 4, wherein a thickness of the N− doping layer is substantially 200 nm.

8. The schottky diode of claim 1, wherein a doping concentration of the N-type well is substantially $10^{16}$ to $5 \times 10^{17}/cm^3$.

9. The schottky diode of claim 1, wherein the N+ doping layer and the N− doping layer contact each other.

10. The schottky diode of claim 1, further comprising a P+ guard ring formed between the N+ doping layer and the N− doping layer.

11. The schottky diode of claim 1, wherein the insulating layer is a shallow trench isolation (STI).

12. A radio frequency identification (RFID) tag in which the schottky diode of claim 1 is used as a rectifying device and a device for bypassing a high voltage.

13. A method for fabricating a schottky diode, the method comprising:
    providing a silicon substrate having a structure in which an N-type well is formed on a P-type substrate;
    forming an insulating layer surrounding a circumference of the N-type well so as to electrically separate the N-type well from the P-type substrate;
    N− doping at least a first portion of a region of an upper surface of the N-type well;
    N+ doping a second portion of the region of the upper surface of the N-type well;
    forming a cathode on the N+ doped portion;
    forming an anode on the N− doped portion; and
    activating the N+ doped portion and the N− doped portion by heat-treating the N+ doped portion and the N− doped portion,
    wherein the doping concentration of the N− doping layer is larger than that of the N type well and less than that of the N+ doping layer.

14. The method of claim 13, wherein a doping concentration of the N+ doped portion is substantially $10^{20}/cm^3$ so that an ohmic contact is formed between the N+ doped portion and the cathode.

15. The method of claim 13, wherein a doping concentration of the N− doped portion is substantially $10^{18}/cm^3$ so that a schottky contact is formed between the N− doped portion and the anode.

16. The method of claim 15, wherein the N− doping is performed using ion implantation.

17. The method of claim 15, wherein the N− doping is performed until a thickness of the N− doped region is substantially 200 nm.

18. The method of claim 13, wherein a doping concentration of the N-type well is substantially $10^{16}$ to $5 \times 10^{17}/cm^3$.

19. The method of claim 13, wherein the forming of the insulating layer comprises:
    forming a trench by etching a circumference of the N-type well; and
    burying an insulating material within the trench.

20. The method of claim 13, wherein the N+ doping is performed so that a portion of the N− doped portion is partly N+ doped.

21. The method of claim 13, wherein the N+ doping is performed so that a non-N− doped portion of the upper surface of the N-type well is partly N+ doped.

22. The method of claim 13, further comprising forming a P+ guard ring between the N+ doped portion and the N− doped portion.

* * * * *